United States Patent
Jang et al.

(10) Patent No.: US 8,368,087 B2
(45) Date of Patent: Feb. 5, 2013

(54) LIGHT EMITTING DEVICE HAVING VERTICAL STRUCTURE AND METHOD FOR MANUFACTURING THE SAME

(75) Inventors: Jun Ho Jang, Gyeonggi-do (KR); Yong Tae Moon, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 152 days.

(21) Appl. No.: 12/725,258

(22) Filed: Mar. 16, 2010

(65) Prior Publication Data

US 2010/0187554 A1    Jul. 29, 2010

Related U.S. Application Data

(63) Continuation of application No. 11/704,390, filed on Feb. 9, 2007, now Pat. No. 7,687,811.

(30) Foreign Application Priority Data

Mar. 21, 2006  (KR) ................... 10-2006-0025691
Mar. 21, 2006  (KR) ................... 10-2006-0025692

(51) Int. Cl.
*H01L 33/00*    (2010.01)

(52) U.S. Cl. ............... 257/84; 257/13; 257/85; 257/94; 257/98; 257/103; 977/834; 977/868; 977/901; 438/42; 438/47

(58) Field of Classification Search ............ 257/79, 257/86, 88, 95, 98, 99, 100, E33.001, E33.067, 257/E33.068, 13, 84, 85, 94, 103; 438/22, 438/42, 47; 977/834, 868, 901

See application file for complete search history.

(56) References Cited

U.S. PATENT DOCUMENTS

| | | | |
|---|---|---|---|
| 7,375,380 B2 | 5/2008 | Asahara et al. | |
| 2005/0067623 A1* | 3/2005 | Ha et al. ................ | 257/79 |
| 2005/0151145 A1* | 7/2005 | Lin et al. ................ | 257/98 |
| 2005/0173714 A1 | 8/2005 | Lee et al. | |
| 2006/0060868 A1 | 3/2006 | Orita | |
| 2006/0163606 A1 | 7/2006 | Wierer et al. | |
| 2007/0166851 A1* | 7/2007 | Tran et al. .............. | 438/22 |

FOREIGN PATENT DOCUMENTS

| | | | |
|---|---|---|---|
| JP | 09-008403 | | 1/1997 |
| JP | 2000-101139 A | | 4/2000 |
| JP | 2006-049855 A | | 2/2006 |
| JP | 2006-073822 | | 3/2006 |
| KR | 10-2005-0041536 | * | 5/2005 |
| WO | WO 2006-006555 | | 1/2006 |

OTHER PUBLICATIONS

Machine Translation of 10-2005-0041536.*

* cited by examiner

*Primary Examiner* — Ha Tran T Nguyen
*Assistant Examiner* — Suberr Chi
(74) *Attorney, Agent, or Firm* — McKenna Long & Aldridge LLP

(57) ABSTRACT

A light emitting device having a vertical structure and a method for manufacturing the same, which are capable of increasing light extraction efficiency, are disclosed. The method includes forming a light extraction layer on a substrate, forming a plurality of semiconductor layers on the light extraction layer, forming a first electrode on the semiconductor layers, forming a support layer on the first electrode, removing the substrate, and forming a second electrode on a surface from which the substrate is removed.

32 Claims, 9 Drawing Sheets

LIGHT EMITTING DEVICE HAVING VERTICAL STRUCTURE AND METHOD FOR MANUFACTURING THE SAME

This application is a continuation of prior U.S. patent application Ser. No. 11/704,390 filed Feb. 9, 2007 now U.S. Pat. No. 7,687,811, which claims priority to Korean Patent Application Nos. 10-2006-0025691, filed Mar. 21, 2006 and 10-2006-0025692, filed Mar. 21, 2006 all of which are incorporated by reference for all purposes as if fully set forth herein.

BACKGROUND OF THE INVENTION

1. Field of the Invention

The present invention relates to a light emitting device having a vertical structure, and more particularly, to a light emitting device having a vertical structure and a method for manufacturing the same which are capable of increasing light extraction efficiency.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

Gallium nitride (GaN) compound semiconductor has been highlighted in the field of high-power electronic devices because it exhibits a high thermal stability and a wide band gap of 0.8 to 6.2 eV. One of the reasons why GaN compound semiconductor has been highlighted is that it is possible to fabricate a semiconductor layer capable of emitting green, blue, or white light, using GaN in combination with other elements, for example, indium (In), aluminum (Al), etc.

Thus, it is possible to adjust the wavelength of light to be emitted, using GaN in combination with other appropriate elements. Accordingly, where GaN is used, it is possible to appropriately determine the materials of a desired LED in accordance with the characteristics of the apparatus to which the LED is applied. For example, it is possible to fabricate a blue LED useful for optical recording or a white LED to replace a glow lamp.

On the other hand, initially-developed green LEDs were fabricated using GaP. Since GaP is an indirect transition material causing degradation in efficiency, the green LEDs fabricated using this material cannot practically produce light of pure green. By virtue of the recent success of growth of an InGaN thin film, however, it has been possible to fabricate a high-luminescent green LED.

By virtue of the above-mentioned advantages and other advantages of GaN-based LEDs, the GaN-based LED market has rapidly grown. Also, techniques associated with GaN-based electro-optic devices have rapidly developed since the GaN-based LEDs became commercially available in 1994.

GaN-based LEDs have been developed to exhibit light emission efficiency superior over that of glow lamps. Currently, the efficiency of GaN-based LEDs is substantially equal to that of fluorescent lamps. Thus, it is expected that the GaN-based LED market will grow significantly.

Despite the rapid advancement in technologies of GaN-based semiconductor devices, the fabrication of GaN-based devices suffers from a great disadvantage of high-production costs. This disadvantage is closely related to difficulties associated with growing of a GaN thin film (epitaxial layer) and subsequent cutting of finished GaN-based devices.

Such a GaN-based device is generally fabricated on a sapphire ($Al_2O_3$) substrate. This is because a sapphire wafer is commercially available in a size suited for the mass production of GaN-based devices, supports GaN epitaxial growth with a relatively high quality, and exhibits a high processability in a wide range of temperatures.

Further, sapphire is chemically and thermally stable, and has a high-melting point enabling implementation of a high-temperature manufacturing process. Also, sapphire has a high bonding energy (122.4 Kcal/mole) and a high dielectric constant. In terms of a chemical structure, the sapphire is a crystalline aluminum oxide ($Al_2O_3$).

Meanwhile, since sapphire is an insulating material, available LED devices manufactured using a sapphire substrate (or other insulating substrates) are practically limited to a lateral or vertical structure.

FIG. 1 shows a structure of an LED device having a lateral structure of the aforesaid general GaN-based LEDs.

A lateral type LED device includes an n-type GaN layer 2 formed on a sapphire substrate 1, an active layer 3 (light emitting layer) formed on the n-type GaN layer 2, and a p-type GaN layer 4 formed on the active layer 3. An n-type electrode 5 is formed on a surface of the n-type GaN layer 2, from which the active layer 3 is removed. A p-type electrode 6 is formed on the p-type GaN layer 4.

Recent researches in the GaN-based semiconductor light emitting devices are focused on the increase of luminance. Methods for increasing luminance of the light emitting devices include a method for improving internal quantum efficiency and a method for improving light extraction efficiency. Recently, researches in the method for improving the light extraction efficiency have been actively proceeded.

The representative methods for increasing the light extraction efficiency include a method of etching the sapphire substrate with a regular pattern, roughening a surface of the p-type GaN layer, and forming a photonic crystal with a constant period by etching the p-type GaN layer.

At present, the methods of etching the sapphire substrate and roughening the surface of the p-type GaN layer are applied to the mass production technologies of the light emitting devices. The method using the photonic crystal has been theoretically well known and studied through laboratorially simulated experiment. However, the method using the photonic crystal is not applied to the mass production technologies of the light emitting devices until now.

The method using the photonic crystal has superior light extraction efficiency to the methods of etching the sapphire substrate and roughening the surface of the p-type GaN layer.

As shown in FIG. 2, the representative method using the photonic crystal is to form a photonic crystal 7 by etching the p-type GaN layer 4 with a constant periodical pattern in the basic structure of the LED device depicted in FIG. 1.

However, this method has a limitation in the improvement of the light extraction efficiency, because of basically low electrical features of the p-type GaN layer 4, a thin thickness and degradation of the electrical features by the etching.

Another method is to use a structure that the p-type GaN layer is grown on the substrate, the light emitting layer is grown on the p-type GaN layer 2 and the n-type GaN layer is grown on the light emitting layer, and to form a photonic crystal structure on the n-type GaN layer.

However, basically low electric conductivity of the p-type GaN layer, low crystalline quality and degradation of electrical features by the etching make the growth of the p-type GaN layer on the substrate impossible.

Another method is to grow the n-type GaN layer on the sapphire substrate, to subsequently grow the light emitting layer and the p-type GaN layer, and then to grow the n-type GaN layer again. This method is to use electric tunnel junction characteristics between the p-type GaN layer and the n-type GaN layer.

However, because of low electrical features of the p-type GaN layer, this method also has problem that resistance at a junction portion is increased and resultantly operating voltage of the device is increased.

Yet another method is to sequentially grow the n-type GaN layer, the light emitting layer and the p-type GaN layer over the sapphire substrate, to bond a reflective layer and a metal plate having a good heat dissipating effect, and to form the photonic crystal by etching the exposed surface of the n-type GaN layer, from which the sapphire substrate is removed.

However, because the metal plate is not stable sufficiently in the etching process of the thin film layer, it is difficult to perform the etching process, and productivity is low.

SUMMARY OF THE INVENTION

Accordingly, the present invention is directed to a light emitting device having a vertical structure and a method for manufacturing the same that substantially obviate one or more problems due to limitations and disadvantages of the related art.

An object of the present invention is to provide a light emitting device having a vertical structure and a method for manufacturing the same which can achieve a high-brightness and high-efficient light emitting device by adapting a photonic crystal structure capable of improving light extraction efficiency to the light emitting device.

Another object of the present invention is to provide a light emitting device having a vertical structure and a method for manufacturing the same which can improve crystalline quality of a thin film by growing the thin film selectively on a light extraction structure formed in a specific shape.

Yet another object of the present invention is to provide a light emitting device having a vertical structure and a method for manufacturing the same which can improve efficiency of a light emitting device by controlling strain in a thin film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve the object and other advantages and in accordance with the purpose of the invention, as embodied and broadly described herein, a method for manufacturing a light emitting device having a vertical structure comprises: forming a light extraction layer on a substrate; forming a plurality of semiconductor layers on the light extraction layer; forming a first electrode on the semiconductor layers; forming a support layer on the first electrode; removing the substrate; and forming a second electrode on a surface from which the substrate is removed.

In another aspect of the present invention, a light emitting device having a vertical structure comprises: a support layer; a first electrode disposed on the support layer; a plurality of semiconductor layers disposed on the first electrode; a photonic crystal layer disposed on the semiconductor layers, the photonic crystal layer being formed by a plurality of holes arranged periodically; and a second electrode disposed on the photonic crystal layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3 to 8 are sectional views illustrating a method for manufacturing a light emitting device having a vertical structure in accordance with a first embodiment of the present invention, in which:

FIG. 3 is a sectional view illustrating a process of forming a semiconductor layer on a substrate;

FIG. 4 is a sectional view illustrating a process of forming a photonic crystal on a semiconductor layer;

FIG. 5 is a plan view of FIG. 4;

FIG. 6 is a sectional view illustrating a process of filling dielectric material in photonic crystal;

FIG. 7 is a sectional view illustrating a process of forming a plurality of semiconductor layers on a photonic crystal structure; and FIG. 8 is a sectional view illustrating a process of forming an electrode and a support layer on semiconductor layers;

FIGS. 10 to 12 are sectional views illustrating a method for manufacturing a light emitting device having a vertical structure in accordance with a second embodiment of the present invention, in which:

FIG. 10 is a sectional view illustrating a substrate;

FIG. 11 is a sectional view illustrating a process of forming columns of dielectric material on a substrate; and FIG. 12 is a plan view of FIG. 11;

FIGS. 13 to 17 are sectional views illustrating a method for manufacturing a light emitting device having a vertical structure in accordance with a third embodiment of the present invention, in which:

FIG. 13 is a sectional view illustrating a process of forming a semiconductor thin film on a substrate;

FIG. 14 is a sectional view illustrating a process of forming columns of dielectric material on a semiconductor thin film;

FIG. 15 is a plan view of FIG. 14;

FIG. 16 is a sectional view illustrating a process of forming a plurality of semiconductor layers on columns of dielectric material; and FIG. 17 is a sectional view illustrating a process of forming a first electrode and a support layer on semiconductor layers.

DETAILED DESCRIPTION OF THE INVENTION

Figure 1:
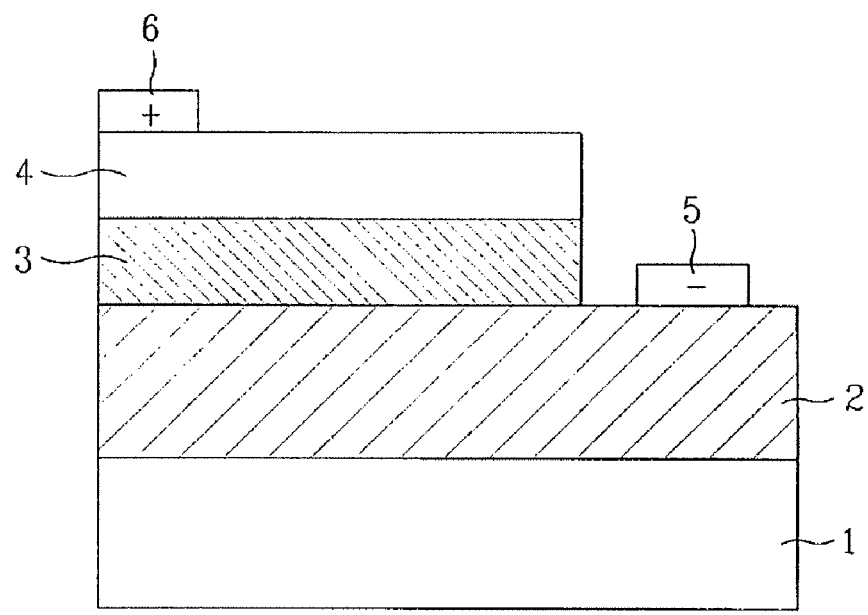
FIG. 1 is a sectional view illustrating an example of a conventional light emitting device having a lateral structure.
Figure 2:
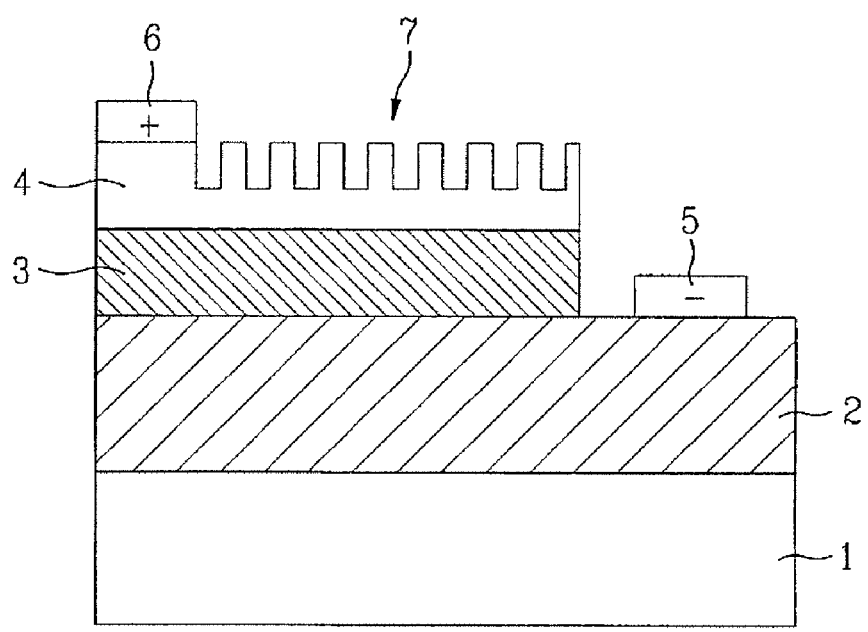
FIG. 2 is a sectional view illustrating an example of a conventional light emitting device having a lateral structure, at which a photonic crystal is formed.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like reference numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner", it is farther from the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

<First Embodiment>

Hereinafter, a first embodiment of the present invention will be described with reference to FIGS. 3 to 8.

Figure 3:
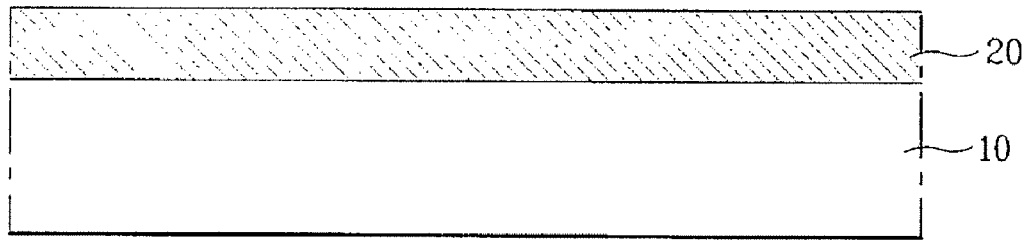

In order to form a light extraction layer on a substrate, as shown in FIG. 3, a substrate 10 is subjected to surface treatment through a wet treatment process or a dry treatment process, and a GaN semiconductor layer 20 is formed on the substrate 10 by using a common semiconductor thin film growing device.

The substrate 10 may be made of material selected from the group consisting of sapphire, silicon (Si), zinc oxide (ZnO), silicon carbide (SiC), and a combination thereof. Preferably, the GaN semiconductor layer 20 is grown to a thickness of 0.3 to 5 μm. The GaN semiconductor layer 20 may be formed using n-type GaN material.

Figure 4:
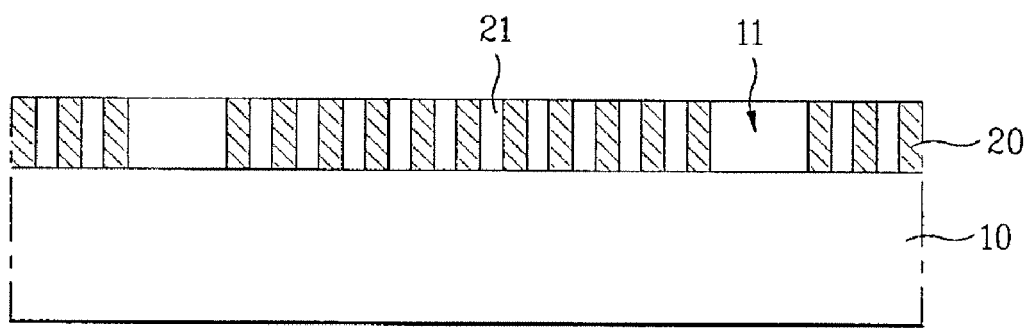
Figure 5:
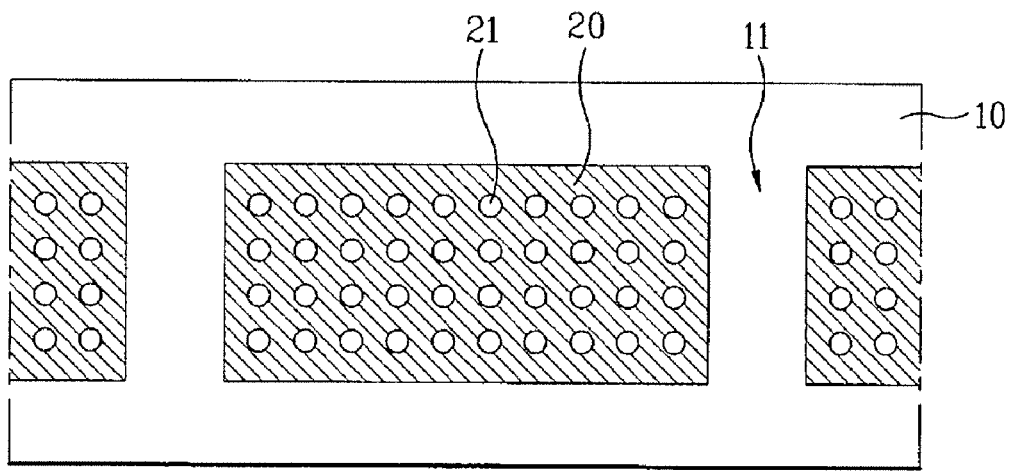

As shown in FIG. 4, holes 21 with regular period and pattern are formed on the GaN semiconductor layer 20 by using a patterning process and an etching process. The planar shape of the substrate 10 and the GaN semiconductor layer 20 with holes 21 is as that depicted in FIG. 5.

Although the holes 21 do not have regular period and pattern, when the substrate 10 is removed later on to expose a light emitting surface of a light emitting device, the holes 21 can increase light emitting efficiency of the light emitting device.

It is illustrated in FIG. 4 that the holes 21 have a circular shape, but the holes 21 may be formed in a polygonal shape like a rectangle, a hexagon, etc.

Further, when the holes 21 are formed on a nitride semiconductor thin film layer while being aligned with regular period and pattern, a photonic crystal structure can be formed on the light emitting surface by the regularly-aligned holes 21.

If the photonic crystal structure is formed, a refractive index is varied periodically in the photonic crystal structure. When a period of the photonic crystal is about a half of a wavelength of the emitted light, a photonic band gap is formed by multiple photonic scattering by a photonic crystal lattice in which the refractive index is varied periodically.

Such a photonic crystal structure has features of effectively emitting the light in a constant direction. Because of the photonic band gap, a phenomenon may happen that the emitted light cannot go into nor pass through the holes 21 forming the photonic crystal structure and is extracted through portions except for the holes 21.

This phenomenon can be explained by the photon movement in the photonic crystal structure which is formed by a plurality of holes 21 having the periodicity.

In other words, by a plurality of holes 21 having the periodicity, the dielectric constant in the photonic crystal structure is modulated periodically, and light movement in the photonic crystal structure is influenced.

Especially, when the photonic band gap in the photonic crystal structure is included in the wavelength band of the light emitted from the light emitting device, the photons of the light emitting device have an effect just as being reflected from the light emitting device by a total reflection phenomenon.

The photonic band gap has a similarity to an electron in the photonic crystal structure, and the photons belonging to the photonic band gap cannot be propagated freely in the photonic crystal.

Accordingly, if all of the photons of the light emitted from the light emitting device belong to the photonic band gap, all photons get out of the light emitting device through the portions except for the holes 21 just like the total reflection phenomenon, thereby increasing the light emitting efficiency.

In order that the photonic crystal structure effectively emits the light, it is preferred that the depth of the holes 21, the size of the holes 21 and the distance between two adjacent holes 21 are optimized according to the wavelength of the emitted light.

In the case of the nitride semiconductor light emitting device, it is preferred that the depth of the holes 21 is set to be 0.05 to 10 μm, the radius of the holes 21 is set to be 0.01 to 6 μm, and the distance between two adjacent holes 21, i.e., the period of the photonic crystal is set to be 0.03 to 18 μm.

Meanwhile, together with the holes 21, it is preferable to form unit-device division regions 11 by etching, which partition the devices from each other.

Figure 6:
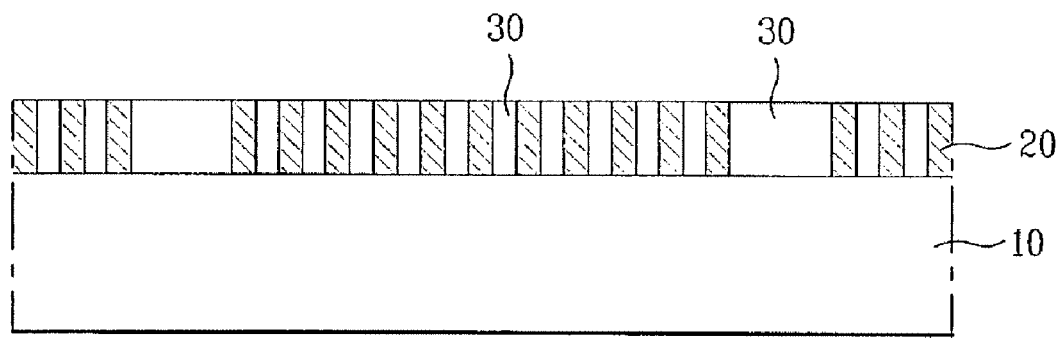

As shown in FIG. 6, the material having different refractive index may be filled in the holes 21 and the unit-device division regions 11 which are formed by etching.

It is preferable to use a dielectric material 30 like silicon dioxide (SiO$_2$) or silicon nitride (SiN) as the material having different refractive index. If the holes 21 are formed sufficiently small and deeply, the dielectric material 30 may be not filled in the holes 21.

Figure 9:
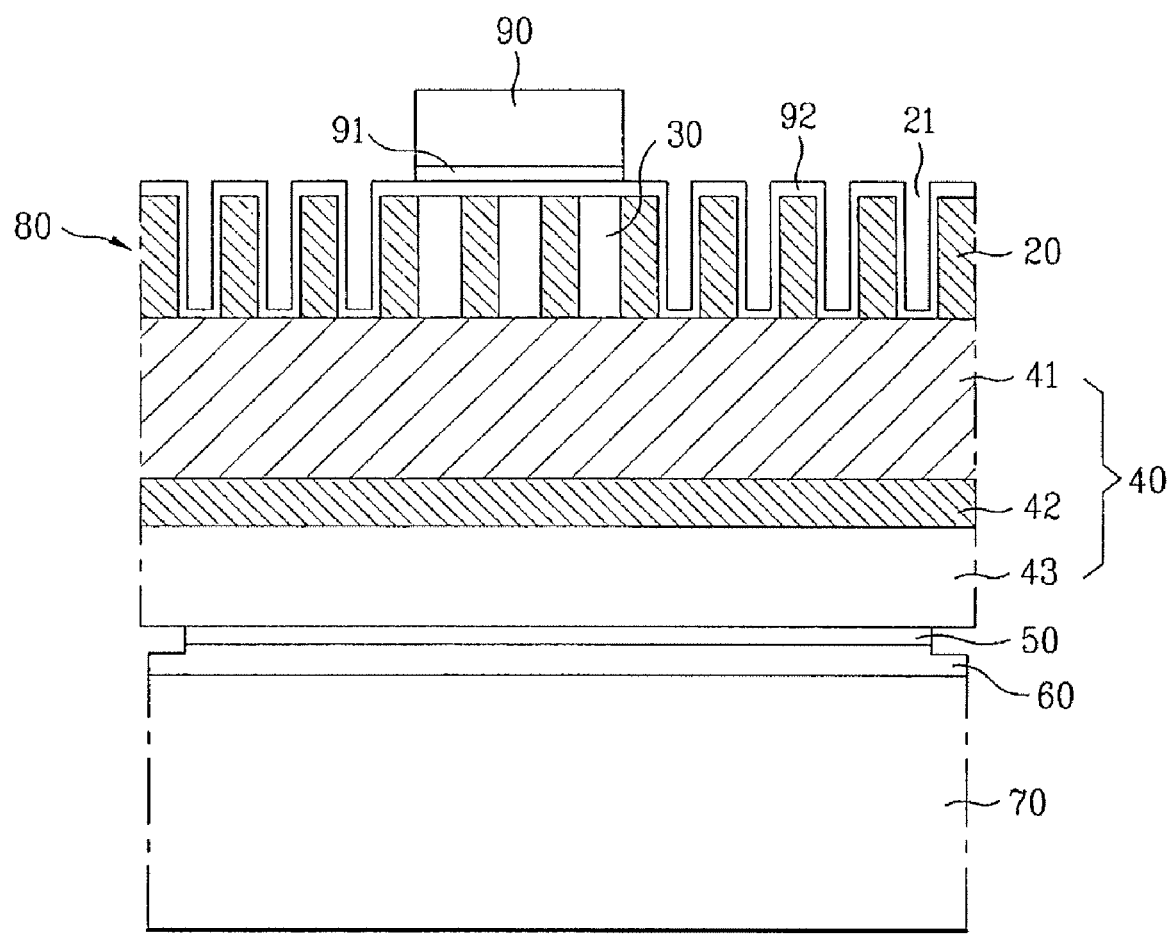
FIG. 9 is a sectional view illustrating an exemplary embodiment of a light emitting device having a vertical structure in accordance with the present invention.

Also, the dielectric material 30 may be filled in at least a certain portion of the holes 21, and an n-type electrode may be formed on the region filled with the dielectric material 30 (refer to FIG. 9).

Figure 7:
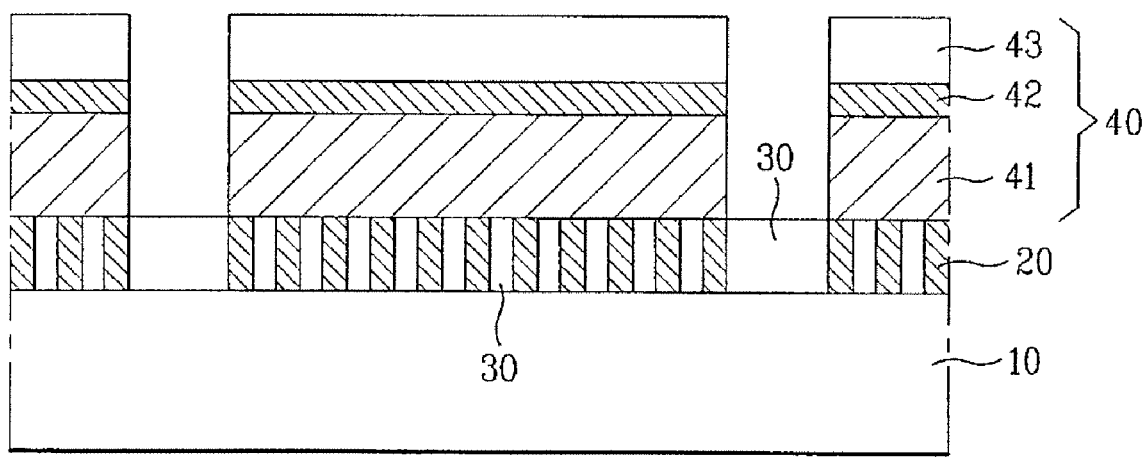

As shown in FIG. 7, a plurality of GaN-based semiconductor layers 40 are formed on the holes 21 filled with the dielectric material 30.

The GaN-based semiconductor layers 40 include an n-type GaN layer 41, a light emitting layer (active layer) 42, and a p-type GaN layer 43. The light emitting layer has typically single or multiple quantum wells structure. At this time, in order to achieve the quantum well structure, indium (In) or aluminum (Al) may be combined with the GaN material.

As described above, by forming the division regions 11 for partitioning the devices from each other together with the holes 21, it is unnecessary to separate the respective devices in a post-treatment process after fabricating the light emitting devices.

This is because the GaN thin film is not formed on the dielectric material 30 filled in the division regions 11 etched for partitioning the devices from each other and is selectively formed only on the photonic crystal structure (refer to FIG. 7).

Also, if selectively forming the GaN thin film on the photonic crystal structure, the high quality n-type GaN layer 41, light emitting layer 42 and p-type GaN layer 43 can be formed.

This is because the thin film layer formed selectively on the photonic crystal structure can effectively reduce strain caused by the substrate 10.

The reduction of the strain in the thin film layer has an effect of increasing the internal quantum efficiency of the light emitting layer 42.

Further, according to the present invention, because the photonic crystal structure includes a plurality of holes 21 and the dielectric material 30 filled in the holes 21, the semiconductor layers 40 grown on the photonic crystal structure can decrease a threading dislocation density, which is a defect of the thin film originating from the interface between the substrate 10 and the semiconductor layers 40, to about a half. The decrease of the threading dislocation density can considerably contribute to the improvement of the performance of the device.

Figure 8:
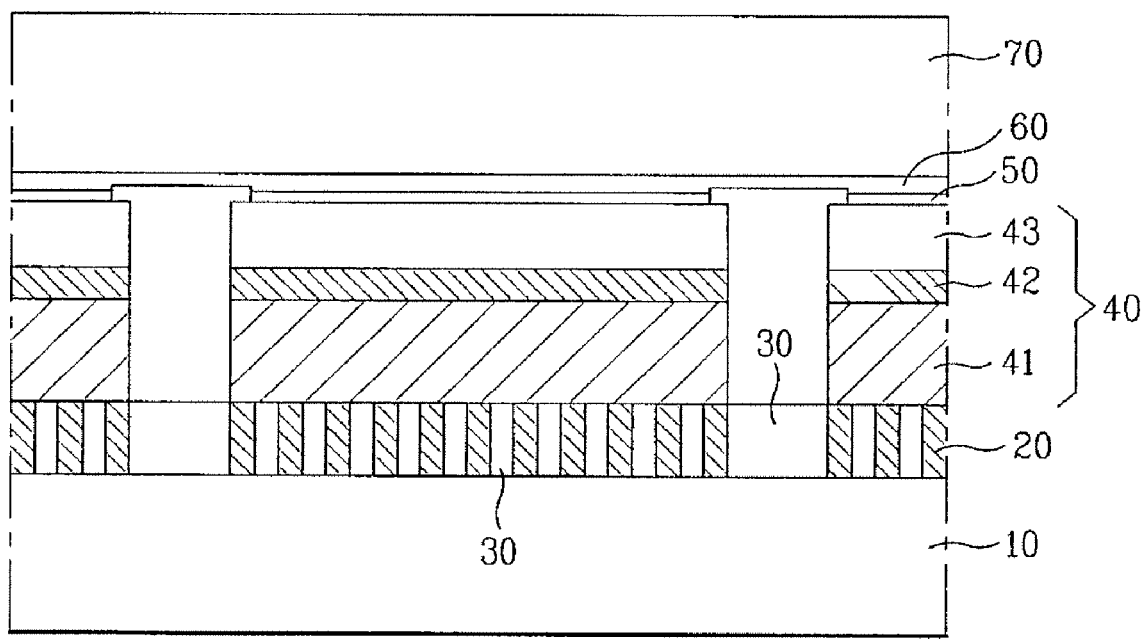

Afterwards, as shown in FIG. 8, a material such as epoxy or the like, which can be thermochemically removed with ease, is filled in the division regions 11 provided between the divided devices, and a p-type electrode 50 is formed on the GaN-based semiconductor layers 40. The p-type electrode forms an ohmic electrode, and a reflective electrode 60 for increasing the reflection efficiency may be formed on the p-type electrode 50.

At this time, the timing of filling the material such as epoxy in the division regions 11 may be varied.

When using an oxide layer made of indium tin oxide, zinc oxide (ZnO) or the like as the p-type electrode 50, a thin n-type GaN layer (not shown) may be additionally formed on the p-type GaN layer 43 in order to improve the ohmic characteristics.

A support layer 70 is formed or adhered onto the p-type electrode 50 or the reflective electrode 60, so as to function as a support plate for supporting the overall device structure when removing the substrate 10 later on.

The support layer 70 may be configured as a metal plate having a high heat dissipation effect, which is made of material selected from the group consisting of copper (Cu), gold (Au), nickel (Ni), and an alloy thereof, or as a silicon (Si) substrate. Also, the metal plate may be formed on the reflective electrode 60 by plating.

When the metal plate is provided as the support layer 70, a seed metal may be used for the junction between the support layer 70 and the p-type electrode 50 or between the support layer 70 and the reflective electrode 60.

The next process is to remove the substrate 10, on which the GaN semiconductor layers 40 are grown. In the case of the sapphire substrate 10, it can be removed physically or by using laser. In the case of the silicon substrate, it can be removed chemically or physically. It is preferred that the surface, from which the substrate 10 is removed, is subjected to the surface treatment by etching.

At this time, as the substrate 10 is removed, the n-type GaN semiconductor layer 20 forming the light extraction layer is exposed. Accordingly, as shown in FIG. 9, the photonic crystal structure 80 including the holes 21 and the dielectric material 30 filled in the holes 21 is exposed.

In some cases, the exposed dielectric material 30 may be removed by etching.

An n-type electrode 90 is formed on the surface, from which the substrate 10 is removed. Even when the dielectric material 30 is removed, it is preferable not to remove the dielectric material 30 which is provided at the region where the n-type electrode 90 is formed.

Also, an n-type transparent ohmic layer 92 may be formed on the exposed n-type GaN semiconductor layer 20 and the holes 21, so as to improve the light emitting efficiency by the current diffusion. The n-type transparent ohmic layer is made of titanium/aluminum (Ti/Al) or titanium/gold (Ti/Au), and is formed with a thickness less than a specific value for the transparency.

Meanwhile, a reflective layer 91 may be formed beneath the n-type electrode 90, so that the light emitted from the light emitting layer 42 is not absorbed in the n-type electrode 90 and is reflected from the reflective layer 91 to be dissipated outside.

Throughout the above-described processes, the light emitting device according to the present invention has a structure as depicted in FIG. 9.

Hereinafter, the particular embodiment of the present invention will be described with reference to FIGS. 3 to 9.

In this embodiment of the present invention, a metal organic chemical vapor deposition (MOCVD) system is used for the growth of the nitride semiconductor thin film.

Sapphire is used for the substrate 10. Ammonia is used as the nitrogen source, and hydrogen and nitrogen are used as the carrier gas.

Gallium (Ga), indium (In) and aluminum (Al) are used as the metal organic source. Silicon (Si) is used as the n-type dopant, and magnesium (Mg) is used as the p-type dopant.

The n-type GaN semiconductor layer 20 is grown on the sapphire substrate 10 to the thickness of 3 μm at the temperature of 1030° C. and the pressure of 250 Torr.

The photonic crystal period is 1.2 μm, the radius of the holes 21 is 0.4 μm, and the etching depth is 3 μm. Silicon dioxide (SiO$_2$) as the dielectric material 30 is filled in the etched portions.

The n-type GaN layer 41 is grown on the photonic crystal structure to the thickness of 3 μm. The light emitting layer 42 having five pairs of multiple quantum wells structure of indium gallium nitride/gallium nitride (InGaN/GaN) is formed on the n-type GaN layer 41.

The p-type GaN layer 43 is grown on the light emitting layer 42 to the thickness of 0.1 μm, and the n-type GaN layer is formed thinly on the p-type GaN layer 43 to improve the ohmic characteristics.

Epoxy is filled in the regions between the adjacent devices, indium tin oxide (ITO) is deposited as the p-type electrode 50 to the thickness of 0.2 μm, and the reflective electrode 60 and the support layer 70 made of copper (Cu) are formed.

Afterwards, the sapphire substrate 10 is removed by using laser, and the exposed surface is etched by 0.5 μm to remove the crystal defect layer.

After the chemical surface-treatment on the exposed surface, the n-type electrode 90 is formed.

According to the experimental results of measuring the characteristics of the light emitting device which is formed throughout the above processes and separated into the single device to be packaged, the brightness of the device is improved by above 30%, as compared with a conventional device.

<Second Embodiment>

Hereinafter, a second embodiment of the present invention will be described with reference to FIGS. 10 to 12.

Figure 10:

In order to form a light extraction layer on a substrate, as shown in FIG. 10, a substrate 100 is subjected to surface treatment through a wet treatment process or a dry treatment process. The substrate 100 may be made of material selected from the group consisting of sapphire, silicon (Si), zinc oxide (ZnO), silicon carbide (SiC), and a combination thereof.

Figure 11:
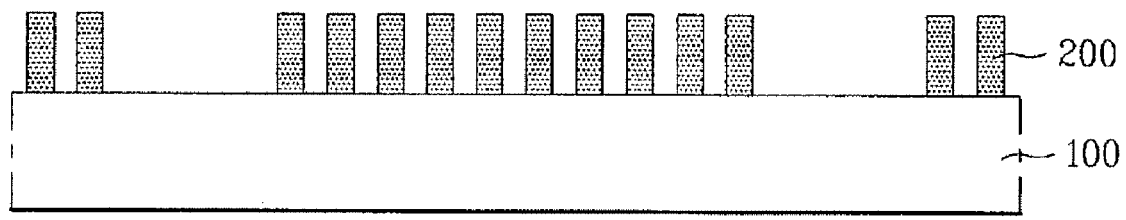
Figure 12:
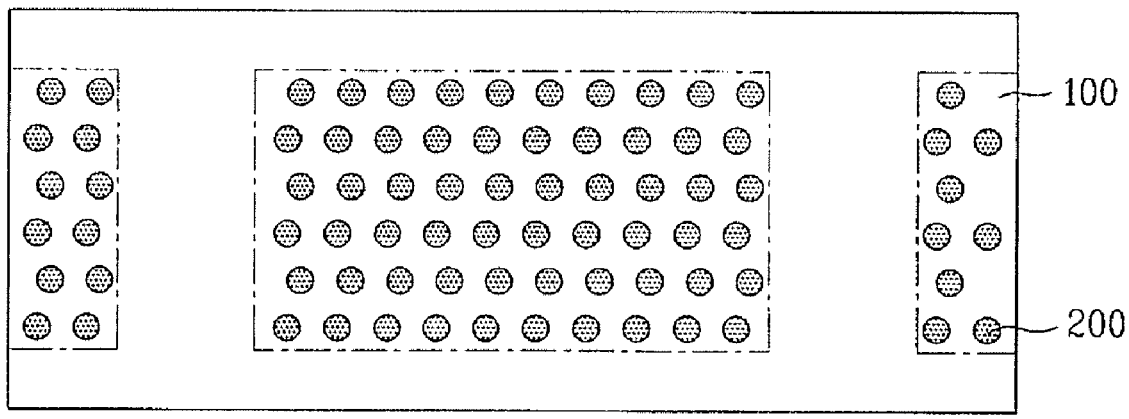

As shown in FIG. 11, a plurality of columns 200 of dielectric material are formed on the substrate 100. The columns 200 of dielectric material have a cross section of a circular shape or a polygonal shape like a rectangle, a hexagon, etc.

The columns 200 of dielectric material may be made of oxide or nitride, and more particularly, silicon dioxide ($SiO_2$) or silicon nitride (SiN).

The columns 200 of dielectric material may be formed through a patterning process or an etching process. In other words, a dielectric material layer is firstly formed, and the dielectric material layer is secondarily etched to form the columns 200 of dielectric material.

The columns 200 of dielectric material may be formed on the overall region. However, in some cases, the columns 200 of dielectric material may be formed only on the regions where the unit device is formed, as shown in FIG. 11. Also, in the unit-device division regions, the dielectric material may be not formed in a columnar shape, but may be filled therein (not shown). FIG. 12 illustrates the planar shape of the columns 200 of dielectric material which are formed only on the regions where the unit device is formed.

<Third Embodiment>

Hereinafter, a third embodiment of the present invention will be described with reference to FIGS. 13 to 17.

Figure 13:
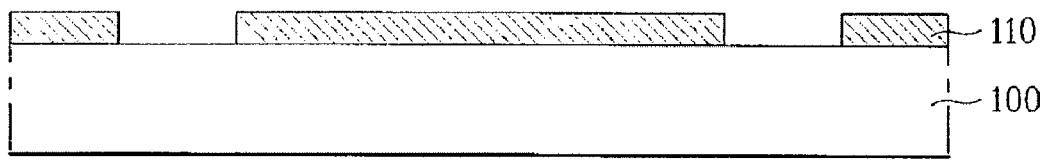

As shown in FIG. 13, a GaN semiconductor thin film 110 is grown on a substrate 100 by using a common semiconductor thin film growing device, and columns 200 of dielectric material are formed on the GaN semiconductor thin film 110.

At this time, the GaN semiconductor thin film 110 may be formed only on the regions where the unit device is formed. Alternatively, the semiconductor thin film 110 may be firstly formed on the overall surface, and a portion of the semiconductor thin film positioned on the unit-device division regions may be secondarily etched to be removed.

It is preferable to set the thickness of the thin film 110 to be 0.001 to 5 μm. The thin film 110 may function as a buffer layer on the substrate 100.

Figure 14:
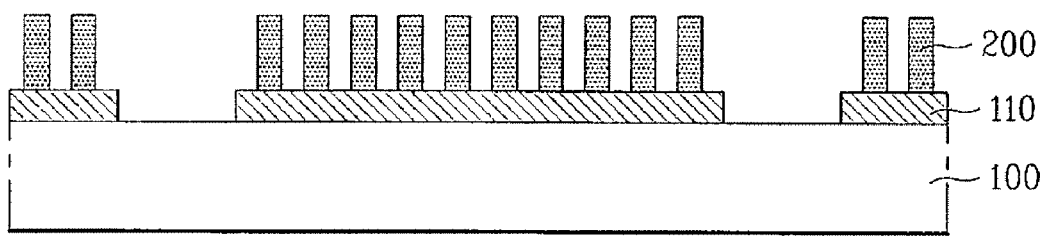

As shown in FIG. 14, the columns 200 of dielectric material are formed on the GaN semiconductor thin film 110.

Figure 15:
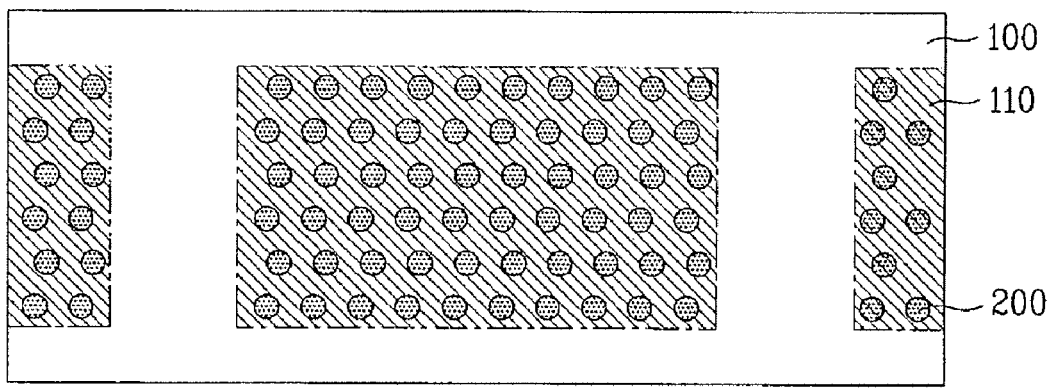

FIG. 15 illustrates the planar shape of the columns 200 of dielectric material formed on the GaN semiconductor thin film 110.

Also, the columns 200 of dielectric material may be not formed in the unit-device division regions, and the dielectric material may be filled in the overall division regions.

The following processes will be described based on the structure of forming the columns 200 of dielectric material on the GaN semiconductor thin film 110. However, the following processes can also be applied to a structure of forming the columns 200 of dielectric material directly on the substrate 100.

Figure 16:
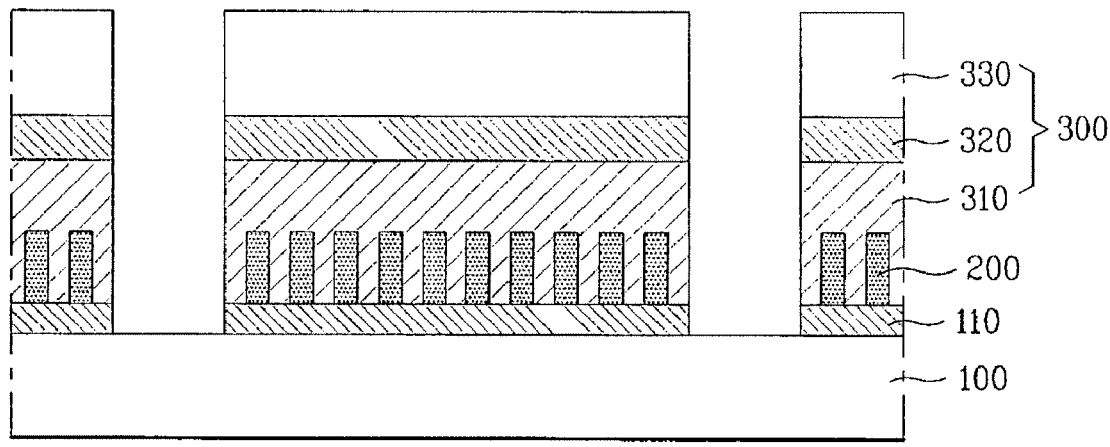

As shown in FIG. 16, a plurality of GaN-based semiconductor layers 300 are formed on the GaN semiconductor thin film 110 on which the columns 200 of dielectric material are formed.

The GaN-based semiconductor layers 300 include an n-type GaN layer 310, a light emitting layer (active layer) 320, and a p-type GaN layer 330. The light emitting layer has typically single or multiple quantum wells structure. At this time, in order to achieve the quantum well structure, indium (In) or aluminum (Al) may be combined with the GaN material.

At first, the n-type GaN layer 310 is not formed over the columns 200 of dielectric material, and is formed only on the thin film 110 between the columns 200 of dielectric material.

If the n-type GaN layer 310 is formed on the thin film 110 between the columns 200 of dielectric material and covers the columns 200 of dielectric material, the n-type GaN layer 310 is grown to form a layer as illustrated in FIG. 16.

Because the dielectric material (not shown) is filled in the unit-device division regions, the GaN-based semiconductor layers 300 are not formed thereon. Therefore, it is unnecessary to separate the respective devices in a post-treatment process after fabricating the light emitting devices.

Also, if selectively forming the GaN-based semiconductor layers 300 on the columns 200 of dielectric material, the high quality n-type GaN layer 310, light emitting layer 320 and p-type GaN layer 330 can be formed.

This is because the thin film layer formed selectively on the columns 200 of dielectric material can effectively reduce strain caused by the substrate 100.

The reduction of the strain in the thin film layer has an effect of increasing the internal quantum efficiency of the light emitting layer 320.

Further, according to the present invention, because the columns 200 of dielectric material are positioned beneath the n-type GaN layer 310, the semiconductor layers 300 grown on the columns 200 of dielectric material can decrease a threading dislocation density, which is a defect of the thin film originating from the interface between the substrate 100 and the semiconductor layers 300, to about a half. The decrease of the threading dislocation density can considerably contribute to the improvement of the performance of the device.

Figure 17:
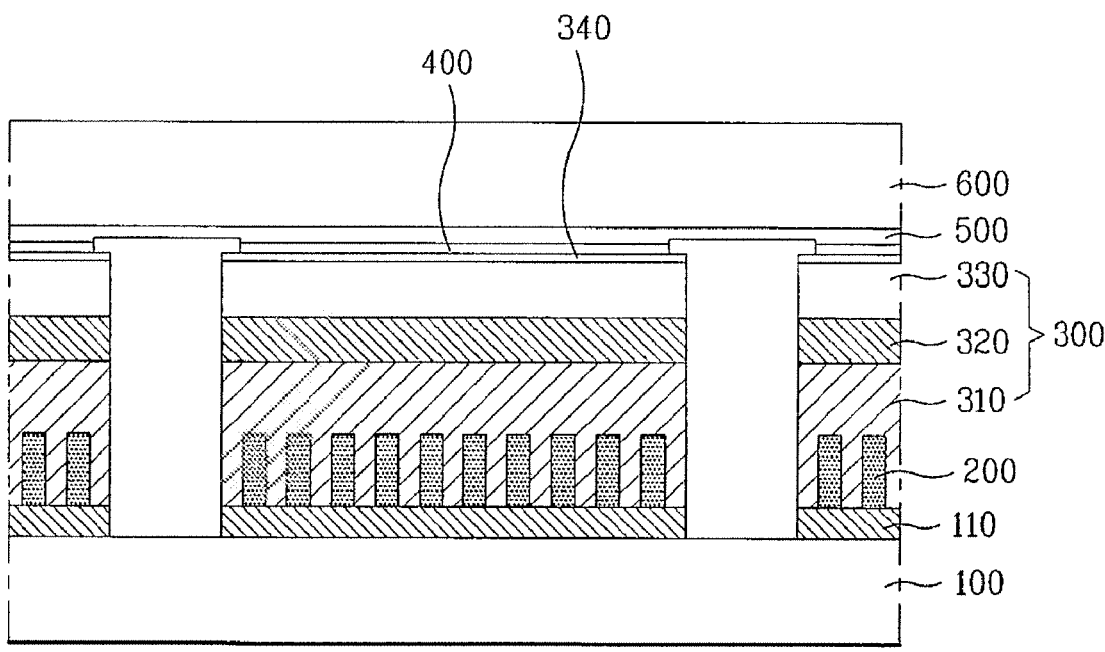

Afterwards, as shown in FIG. 17, a material such as epoxy or the like, which can be thermochemically removed with ease, is filled in the division regions provided between the divided devices, and a p-type electrode 400 is formed on the GaN-based semiconductor layers 300. The p-type electrode 400 forms an ohmic electrode, and a reflective electrode 500 for increasing the reflection efficiency may be formed on the p-type electrode 400.

At this time, the timing of filling the material such as epoxy in the division regions may be varied.

When using an oxide layer made of indium tin oxide (ITO), zinc oxide (ZnO), aluminum zinc oxide (AlZnO), indium zinc oxide (InZnO) or the like as the p-type electrode 400, a thin n-type GaN layer may be additionally formed on the p-type GaN layer 330 as an ohmic-forming layer 340 in order to improve the ohmic characteristics.

A support layer 600 is formed or adhered onto the p-type electrode 400 or the reflective electrode 500, so as to support the overall device structure when removing the substrate 100 later on.

The support layer 600 may be configured as a metal plate having a high heat dissipation effect, which is made of material selected from the group consisting of copper (Cu), gold (Au), nickel (Ni), and an alloy thereof, or as a semiconductor substrate like a silicon (Si) substrate. The metal plate may be formed on the reflective electrode 500 by plating.

When the metal plate is provided as the support layer 600, a seed metal may be used for the junction between the support layer 600 and the p-type electrode 400 or between the support layer 600 and the reflective electrode 500.

The next process is to remove the substrate 100, on which the GaN-based semiconductor layers 300 are grown. In the case of the sapphire substrate 100, it can be removed physically or by using laser. In the case of the silicon substrate, it can be removed chemically or physically. It is preferred that the surface, from which the substrate 100 is removed, is subjected to the surface treatment by etching.

Figure 18:
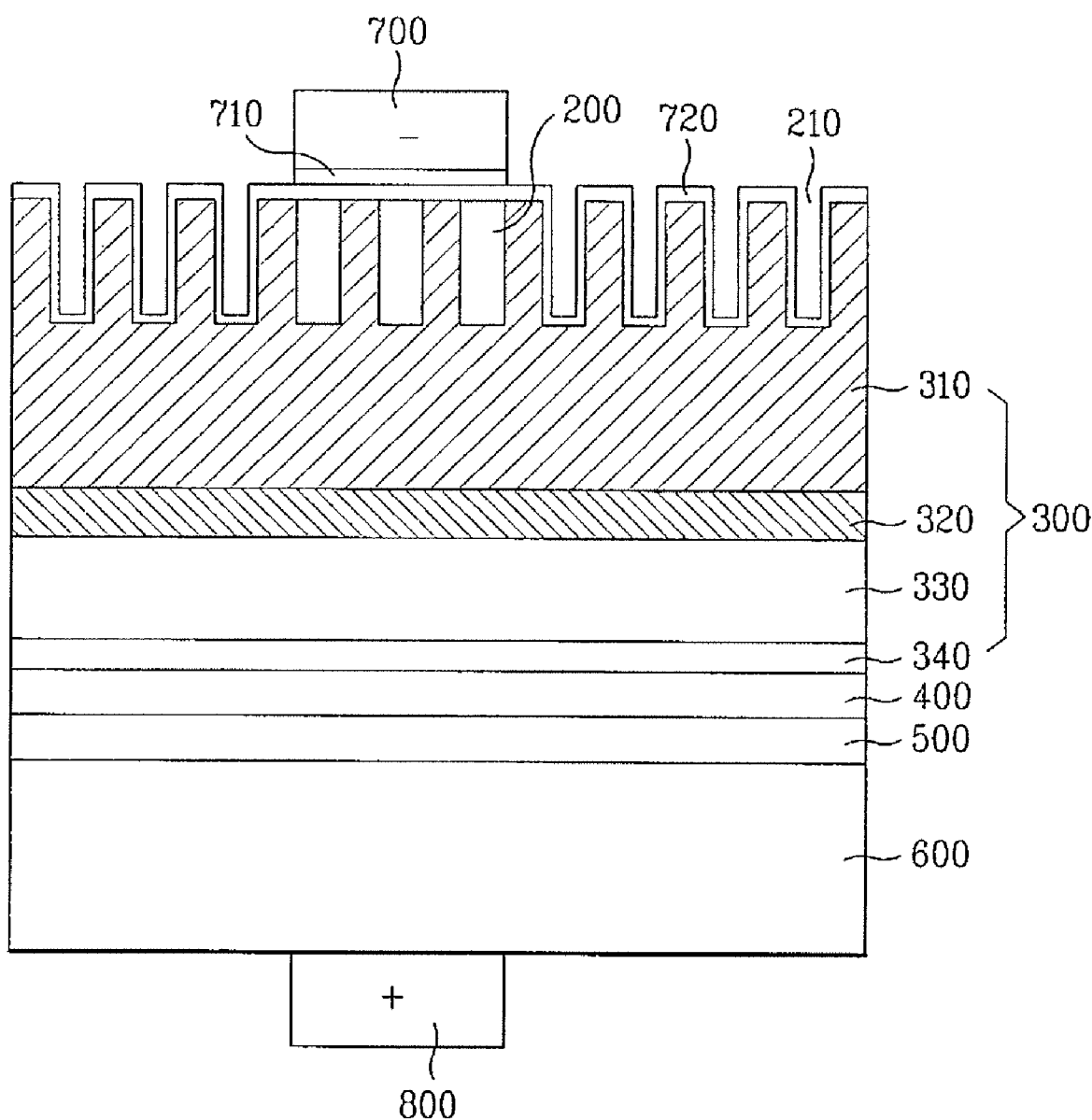
FIG. 18 is a sectional view illustrating another exemplary embodiment of a light emitting device having a vertical structure in accordance with the present invention.

As the substrate 100 is removed, the columns 200 of dielectric material arranged on the n-type GaN layer 310 of the GaN-based semiconductor layers 300 are exposed. In some cases, the columns 200 of dielectric material may be removed by etching. If the columns 200 of dielectric material are removed, as shown in FIG. 18, a plurality of holes 210 are formed on the n-type GaN layer 310.

Although the columns 200 of dielectric material or the holes 210 are not arranged with the regular period and pattern, the light emitting efficiency of the light emitting device can be improved.

Meanwhile, when the columns 200 of dielectric material or the holes 210 are arranged on the nitride semiconductor thin film layer with the regular period and pattern, the photonic crystal structure can be formed on the light emitting surface.

The operational effect of the photonic crystal structure is the same as that of the aforesaid first embodiment.

The photonic crystal structure has features of effectively emitting the light in a constant direction. In other words, because the photonic band gap is formed, a phenomenon may happen that the emitted light cannot go into nor pass through the columns 200 of dielectric material or the holes 210 forming the photonic crystal structure and is extracted through portions except for the columns 200 of dielectric material or the holes 210.

This phenomenon can be explained by the photon movement in the photonic crystal structure which is formed by a plurality of holes 210 having the periodicity.

In other words, by a plurality of holes 210 having the periodicity, the dielectric constant in the photonic crystal structure is modulated periodically, and light movement in the photonic crystal structure is influenced.

Accordingly, if all of the photons of the light emitted from the light emitting device belong to the photonic band gap, all photons get out of the light emitting device just like the total reflection phenomenon, thereby increasing the light emitting efficiency.

In order that the photonic crystal structure effectively emits the light, it is preferred that the height and the radius of the columns 200 of dielectric material, the distance between two adjacent columns 200, or the depth of the etched holes 210, the size of the holes 210 and the distance between two adjacent holes 210 are optimized according to the wavelength of the emitted light.

In the case of the nitride semiconductor light emitting device, it is preferred that the height of the columns 200 of dielectric material is set to be 0.001 to 10 µm, the radius of the columns 200 is set to be 0.001 to 6 µm, and the distance between two adjacent columns 200, i.e., the period of the photonic crystal is set to be 0.003 to 18 µm.

As a result, the depth of the holes 210, which are formed by etching the columns 200 of dielectric material, becomes 0.001 to 10 µm, the radius of the holes 210 becomes 0.001 to 6 µm, and the distance between two adjacent holes 210, i.e., the period of the photonic crystal becomes 0.003 to 18 µm.

Throughout the above-described processes, the light emitting device according to the present invention has a structure as depicted in FIG. 18.

Referring to FIG. 18, an n-type electrode 700 is formed on the surface, from which the substrate 100 is removed. Even when the columns 200 of dielectric material are removed by etching, it is preferable not to remove the columns 200 of dielectric material which are provided at the region where the n-type electrode 700 is formed.

Also, an n-type transparent ohmic layer 720 may be formed on the exposed n-type GaN layer 310 and the holes 210, so as to improve the light emitting efficiency by the current diffusion.

Meanwhile, a reflective layer 710 may be formed beneath the n-type electrode 700, so that the light emitted from the light emitting layer 320 is not absorbed in the n-type electrode 700 and is reflected from the reflective layer 710 to be dissipated outside. Additionally, a p-type contact 800 may be formed on the support layer 600 to provide a location for electrical connection.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device having a vertical topology structure, comprising:
    a conductive support structure;
    a first electrode on the conductive support structure;
    a semiconductor structure comprising a p-type semiconductor layer on the first electrode,
    a light emitting layer on the p-type semiconductor layer and an n-type semiconductor layer on
    the light emitting layer;
    a light extraction structure comprising a plurality of holes arranged on the n-type semiconductor layer and a transparent layer contacting a plurality of unfilled holes, wherein the hole plurality of holes have a depth in the range of 0.3 µm to 5 µm;
    a second electrode on the semiconductor structure, the second electrode having a first width in a first direction; and
    a reflective layer located between the transparent layer and the second electrode, the reflective layer having the first width in the first direction,
    wherein the second electrode and the reflective layer overlap with each other across the first width, wherein a dielectric material is formed in the plurality of holes, the dielectric material located between the transparent layer and the n-type semiconductor layer, and wherein the transparent layer is disposed on an inner surface of the plurality of unfilled holes with a thickness smaller than a radius of the plurality of holes, and wherein the transparent layer is configured to enhance light emission efficiency of the device.

2. The light emitting device according to claim 1, wherein a radius of each hole of the plurality of holes is in the range of 0.01 μm to 6 μm.

3. The light emitting device according to claim 1, wherein the plurality of holes are periodically distributed.

4. The light emitting device according to claim 3, wherein the light extraction structure has a period in the range of 0.03 μm to 18 μm.

5. The light emitting device according to claim 3, wherein the first electrode comprises an ohmic electrode and a reflective electrode.

6. The light emitting device according to claim 5, wherein the reflective electrode has a first surface facing the ohmic electrode and a second surface facing the conductive support structure, and wherein an area of the second surface is larger than an area of the first surface.

7. The light emitting device according to claim 1, wherein the transparent layer comprises a transparent ohmic layer.

8. The light emitting device according to claim 7, wherein the transparent ohmic layer comprises at least one of Ti, Al and Au.

9. The light emitting device according to claim 1, wherein the first electrode comprises material selected from the group consisting of ITO, ZnO, AlZnO, InZnO and a combination thereof.

10. The light emitting device according to claim 1, wherein the transparent layer extends outside of the plurality of holes.

11. The light emitting device according to claim 10, wherein the thickness of the transparent layer outside of the plurality of holes is substantially the same as the thickness of the transparent layer disposed on the inner surface of the pluarlity of unfilled holes.

12. The light emitting device according to claim 1, wherein the first electrode has a first surface facing the p-type semiconductor layer and the p-type semiconductor layer has a second surface facing the first electrode, and wherein an area of the second surface is larger than the area of the first surface.

13. The light emitting device according to claim 1, wherein the light extraction structure is an integral element of the n-type semiconductor layer.

14. The light emitting device according to claim 1, wherein the light extraction structure comprises a surface of the n-type semiconductor layer facing the second electrode.

15. The light emitting device according to claim 1, wherein the conductive support structure comprises metal or semiconductor.

16. The light emitting device according to claim 15, wherein the metal comprises at least one of Cu, Au and Ni.

17. The light emitting device according to claim 1, further comprising:
an ohmic-forming layer on the first electrode.

18. The light emitting device according to claim 17, wherein the ohmic-forming layer comprises an n-type GaN layer.

19. The light emitting device according to claim 17, wherein the ohmic-forming layer is configured to improve the ohmic characteristics between the first electrode and the semiconductor structure.

20. The light emitting device according to claim 1, further comprising: a metal layer between the conductive support structure and the first electrode.

21. The light emitting device according to claim 20, wherein the metal layer contacts the conductive support structure.

22. The light emitting device according to claim 20, wherein the metal layer contacts the first electrode.

23. The light emitting device according to claim 1, wherein the transparent layer contacts the second electrode.

24. The light emitting device according to claim 1, wherein the depth of the plurality of holes is substantially the same as the thickness of the n-type semiconductor layer.

25. The light emitting device according to claim 1, wherein the thickness of the light extraction structure is substantially the same as the thickness of the n-type semiconductor layer.

26. The light emitting device according to claim 1, wherein the transparent layer has a substantially uniform thickness at least inside of the plurality of unfilled holes.

27. The light emitting device according to claim 1, wherein the light extraction structure comprises the same material as that of the n-type semiconductor layer.

28. The light emitting device according to claim 1, wherein the conductive support structure contacts the first electrode.

29. The light emitting device according to claim 1, wherein the transparent layer covers an entire upper surface of the n-type semiconductor layer.

30. The light emitting device according to claim 1, wherein the transparent layer is conductive.

31. The light emitting device according to claim 1, wherein the first electrode has a first surface facing the conductive support structure and the conductive support structure has a second surface facing the first electrode, and wherein an area of the first surface is substantially the same as an area of the second surface.

32. The light emitting device according to claim 1, wherein the first electrode has a first surface facing the semiconductor structure, and wherein a side surface of the semiconductor structure is substantially vertical to the first surface of the first electrode.

* * * * *